US006691252B2

(12) United States Patent
Hughes et al.

(10) Patent No.: US 6,691,252 B2
(45) Date of Patent: Feb. 10, 2004

(54) CACHE TEST SEQUENCE FOR SINGLE-PORTED ROW REPAIR CAM

(75) Inventors: Brian William Hughes, Fort Collins, CO (US); Warren Kurt Howlett, Windsor, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 573 days.

(21) Appl. No.: 09/792,476

(22) Filed: Feb. 23, 2001

(65) Prior Publication Data

US 2002/0120887 A1 Aug. 29, 2002

(51) Int. Cl.[7] .................................................. G06F 11/27
(52) U.S. Cl. ............................ 714/30; 714/42; 714/710; 714/718
(58) Field of Search .......................... 714/42, 710, 711, 714/718, 719, 30; 365/189.04

(56) References Cited

U.S. PATENT DOCUMENTS

| 5,255,227 | A | | 10/1993 | Haeffele ...................... 365/200 |
|---|---|---|---|---|
| 5,848,077 | A | * | 12/1998 | Kamae et al. ............... 714/807 |
| 5,896,331 | A | * | 4/1999 | Crafts ......................... 365/201 |
| 5,956,350 | A | * | 9/1999 | Irrinki et al. ................. 714/718 |
| 6,000,047 | A | | 12/1999 | Kamae et al. ............... 714/710 |
| 6,085,334 | A | * | 7/2000 | Giles et al. ..................... 714/7 |
| 6,141,779 | A | | 10/2000 | Hill et al. .................... 714/710 |
| 6,304,989 | B1 | * | 10/2001 | Kraus et al. ................. 714/733 |
| 6,408,401 | B1 | * | 6/2002 | Bhavsar et al. ................. 714/7 |
| 6,421,794 | B1 | * | 7/2002 | Chen et al. .................... 714/42 |
| 6,425,095 | B1 | * | 7/2002 | Yasui ........................... 714/42 |
| 6,438,046 | B1 | * | 8/2002 | Agrawal ..................... 365/200 |
| 6,446,224 | B1 | * | 9/2002 | Chang et al. ................. 714/54 |
| 6,496,947 | B1 | * | 12/2002 | Schwarz ...................... 714/30 |
| 6,505,308 | B1 | * | 1/2003 | Schwarz ...................... 714/30 |
| 6,505,313 | B1 | * | 1/2003 | Phan et al. .................. 714/718 |
| 6,535,993 | B1 | * | 3/2003 | Hamada et al. ................. 714/6 |
| 6,560,740 | B1 | * | 5/2003 | Zuraski, Jr. et al. ......... 714/733 |
| 6,640,321 | B1 | * | 10/2003 | Huang et al. ................ 714/720 |

OTHER PUBLICATIONS

Satoru Tanoi, et al. "On–Wafer BIST if a 200–Gb/s FailedBit Search for 1–Gb DRAM, IEEE Journal of Solid State Circuits," vol. 32, No. 11. (Nov. 1997) 1735–1742.

Jeffrey Dreibelbis, et al. "Processor–Based Built–In Self–Test for Embedded DRAM," IEEE Journal of Solid State Circuits, vol. 33, No. 11. (Nov. 1998) 1731–1740.

Dilip K. Bhavsar, "An Algorithim for Row–Column Self–Repai of RAMs and Its Implementation in he Alpha 21264," ITC International Test Conference Paper 12.3, IEEE. (1999) 311–318.

Akira Tanabe, et al. "A 30–ns 64 Mb DRam with Built–in Self–Test and Self–Repair Function," IEEE Journal of Solid–State Circuits, vol. 27, No. 11, (Nov. 1992) 1525–1533.

* cited by examiner

Primary Examiner—Nadeem Iqbal
Assistant Examiner—Anne L. Damiano

(57) ABSTRACT

The present invention incorporates built-in self test and self repair functionality into a semiconductor memory device in which reconfiguration data used to replace faulty memory is stored at the same time testing to identify other faulty memory cells continues. To avoid access contention conflicts to a content addressable memory used to identify rows or groups of rows having faulty memory cells, the built in test function writes test data to each cell at least twice before reading the stored data. By writing twice before reading, contention problems caused by simultaneous updating of the content addressable memory are avoided. That is, even if the content addressable memory is initially unavailable to process address information used to access a memory cell to be tested, repetition of the write process ensure that the data will be properly stored when the memory again becomes available after being updated.

20 Claims, 9 Drawing Sheets

CACHE TEST SEQUENCE FOR SINGLE-PORTED ROW REPAIR CAM

RELATED APPLICATIONS

The present invention relates to commonly assigned, co-pending U.S. patent application Ser. No. 09/777,202, entitled "A SYSTEM FOR AND METHOD OF OPERATING A PROGRAMMABLE COLUMN FAIL COUNTER FOR REDUNDANCY ALLOCATION," filed Feb. 2, 2001; and commonly assigned, concurrently filed U.S. patent application Ser. No. 09/792,320, entitled "SYSTEM AND METHOD OF OPERATING A PROGRAMMABLE COLUMN FAIL COUNTER FOR REDUNDANCY ALLOCATION," the disclosures of which are hereby incorporated herein by reference.

TECHNICAL FIELD

The present invention relates to a semiconductor memory device, and more particularly to a semiconductor memory device having spare memory cells for replacement of defective memory cells which are then programmably accessible.

BACKGROUND

Modern microprocessors and many Application Specific Integrated Circuits (ASICs) often incorporate large amounts of embedded memory. This memory is typically Static Random Access Memory (SRAM) or Dynamic Random Access Memory (DRAM). These Random Access Memories (RAMs) constitute the majority of transistors contained on a chip and can occupy the largest portion of the surface area of a chip, i.e., chip "real estate." Availability and usability of these RAMs becomes a priority to semiconductor manufacturers. Typically semiconductor manufacturers incorporate a test and a repair scheme which tests RAM cells within the chip and replaces defective RAM cells with spare cells included for that purpose. Typically, columns and/or rows of RAM cells are replaced rather than individual RAM cells. Row substitution may be performed by appropriate changes to the address decoder while column substitution may be performed by MUX selection of appropriate bit lines.

Traditionally, semiconductor manufacturers have used bit maps to determine which RAM columns and/or RAM rows need to be replaced with redundant RAM columns or RAM rows. Identification of defective memory cells is a particular problem when embedded on a microprocessor or ASIC device, since external or off-chip access for testing is limited by the number of pins available. Thus, semiconductor manufacturers have incorporated Built In Self Tests (BISTs) and Built In Self Repair (BISRs) to test and replace RAM cells. Special purpose built-in test hardware is described in detail in the commonly assigned and co-pending U.S. patent application Ser. No. 09/183,536, entitled, "A Flexible And Programmable BIST Engine for On-Chip Memory Array Testing and characterization," filed Oct. 30, 1998, the disclosure of which is hereby incorporated herein by reference.

Typically RAM cells are tested for a number of faults which can be classified into two categories, simple faults and linked faults. Simple faults are those which occur independent of other faults but may induce failures in other cells. Linked faults are when two or more simple faults are acting on a single cell (i.e. multiple faults influencing each other). Simple faults can be further divided into Address Decoder Faults (ADFs) and Memory Cell Array Faults (MCAFs). ADFs are only present in the address decoder and result in the unavailability of a cell, the lack of an address to access a cell, an address accessing multiple cells, or a specific cell being accessible with multiple addresses.

MCAFs can be further broken down into single cell faults and faults which occur between memory cells. Single cell faults include Stuck At Faults (SAFs), Stuck Open Faults (SOFs), Transition Faults (TFs), and Data Retention Faults (DRFs). SAF means a specific cell is either "stuck" at zero or "stuck" at one regardless of the data attempted to be written into the cell. SOF indicates that a memory cell cannot be accessed because of an open line. A TF occurs when a memory cell cannot make a transition from zero to one, or from one to zero. And finally, a DRF occurs when a cell is unable to retain a particular logic value or state for a requisite period of time.

Coupling faults involve two cells. A first cell, the coupling cell, which is the source of the fault, and the second cell, the coupled cell, which is the cell that experiences the fault. These coupling faults can occur either when a transition occurs in the coupling cell or when a specific value is stored in the coupling cell. Transitions in a coupling cell can cause the coupled cell to change from a zero to a one, or vice versa, or can cause a zero or a one to be stored within the coupled cell. Additionally, certain values in coupling cells may bleed through to a coupled cell regardless of the value which should be stored in the coupled cell.

Tests which are applied in parallel to a plurality or group of memory cells, or march tests, consist of a sequence of elements, or "march elements," in which a sequence of operations are defined and corresponding data signals are applied to various memory cells, typically one row or column at a time. The overall memory can be divided into memory groups and these tests can occur in parallel across memory groups. The address order determines the order in which the march test is applied to various address locations within a memory group. A march test may contain the following sequence: write zero, read zero, write one, read one, write zero, read zero. This march test would ensure that a zero could be stored in, and read from, a memory cell, that a one can be stored in, and read from, a memory cell, and that the memory cell can transition from a zero to a one, and from one to zero. These march tests are performed on the memory cells during BIST.

Once faulty memory cells have been identified, BISR is used to replace the faulty memory cells with spare memory cells. This typically occurs a column or row at a time or using multiple spare columns or rows to replace a continuous group of columns or rows (e.g., an address space spanning several rows or columns). Semiconductor manufacturers also combine BIST and BISR in accordance with their testing philosophy. BIST could be completed before the BISR has been implemented and not repeated after array reconfiguration in which faulty rows or columns are replaced with spare ones. Thus, if BIST is completed before BISR is performed, the replacement columns and rows are not typically tested during BIST and columns and rows of cells would be included in the operational memory array which have not successfully past BIST.

Alternatively, and more preferably, BIST and BISR can occur alternatively to ensure that each of the memory cells contained in the final (operational) memory array configuration have been thoroughly tested. For instance, one march test may occur during the first pass of BIST and be used to identify faulty memory cells. Once these faulty memory cells have been identified, a first pass of BISR can be used to replace the rows and/or columns of memory which contain these faulty memory cells. Once the first pass of BISR has been completed, the second pass of BIST can be performed which repeats the first BIST pass or which includes additional march tests to ensure that the replacement rows and/or columns, as configured, are operating properly. A second pass of BISR would be performed at the conclusion of the second pass of BIST to replace any newly identified or remaining faulty rows and/or columns. In addition, other march tests can be performed which test for coupling problems between memory cells in the reconfigured array. A BIST, which identifies memory cells with faults, is always followed by BISR, or the memory array is unrepairable and discarded.

Once a row of memory containing a non-operational cell has been identified, its address is typically stored and mapped to a redundant row. This mapping may occur after each row containing a non-operational cell has been identified, or alternatively, testing may be suspended while the row containing the non-operational cell is mapped to a redundant row. Once the mapping is completed, testing of the remaining rows is resumed. For memory addresses which cannot be accessed or stored in a single clock cycle a pipeline may be implemented to allow the access or storage to occur over numerous clock cycles.

A description of memory testing and the use of redundant memory elements is described in detail in the commonly assigned U.S. Pat. No. 6,141,779, issued Oct. 31, 2000, and co-pending U.S. patent application Ser. No. 09/544,516, entitled "System and Method for Providing RAM Redundancy in the Field," filed Apr. 6, 2000, the disclosures of which are hereby incorporated herein by reference. Also, U.S. Pat. No. 5,255,227 issued Oct. 19, 1993, to Haeftele; U.S. Pat. No. 5,848,077 issued Dec. 8, 1998, to Kamae et al.; and U.S. Pat. No. 6,000,047 issued Dec. 7, 1999, to Kamae et al., each commonly assigned to the assignee of this patent describe similar correction methods and are hereby incorporated herein by reference.

While BIST and BISR provide enhanced testing facilities and rehabilitation of faulty devices, the additional test and repair circuitry and time used limits incorporation of these tools into the already cramped chip real estate. Accordingly, a need exists for a systematic method and approach to test the memory cells contained within a memory array that will minimize the amount of time spent in BIST and BISR while maximizing the identification of faulty memory cells. A need further exists for the efficient use of redundant memory columns and redundant memory rows in the replacement of faulty memory cells. A further need exists for the identification and replacement of faulty memory cells while minimizing the hardware associated with the BIST, BISR, and surface area of the chip dedicated to BIST and BISR.

SUMMARY OF THE INVENTION

The present invention incorporates built-in self test and self repair functionality into a semiconductor memory device in which reconfiguration data used to replace faulty memory is stored at the same time testing to identify other faulty memory cells continues. To avoid access contention conflicts to a content addressable memory used to identify rows or groups of rows having faulty memory cells, the built in test function writes test data to each cell at least twice before reading the stored data. By writing twice before reading, contention problems caused by simultaneous updating of the content addressable memory are avoided. That is, even if the content addressable memory is initially unavailable to process address information used to access a memory cell to be tested, repetition of the write process ensure that the data will be properly stored when the memory again becomes available after being updated.

Thus, according to one aspect of the invention, a method of configuring a memory array to replace faulty memory cells with spare memory cell includes identification of a first address space, the first address space (e.g., row or group of rows) including a faulty memory cell. An attempt to supply data corresponding to a second address space to a content addressable memory and an attempt is made to access at least one memory cell so addressed. During at least some portion of the time that these latter actions occur (i.e., while the CAM is needed to address the memory and test data is to be accessed), data corresponding to the first address space (e.g., the row address of the faulty memory cell) is written into the content addressable memory. An attempt is made to resupply data corresponding to said second address space to the content addressable memory and another attempt is made to access the memory cell addressed. Data is then read from the memory cell and compared with the originally stored test data.

According to another aspect of the invention, a memory includes an array of memory cells including spare memory cells. Memory cell address logic includes a CAM and reconfiguration logic. The CAM stores data representing address spaces corresponding to faulty ones of the memory cells; the memory cell configuration logic is responsive to an output of the CAM for mapping the address spaces corresponding to the faulty memory cells address spaces to respective ones of the spare memory cells. Test logic functions to identify a first address space including a faulty memory cell. The test logic further attempts to supply data (e.g., a partial of full address) corresponding to a second address space to the content addressable memory and attempts to access at least one memory cell in the second address space. The test logic repeats this process by reattempting to supply the data corresponding to the second address space to the content addressable memory and reattempting to access the memory cell addressed. After both access and write operations, the test logic causes data to be read from the memory cell and compares the data as read with the original test data. Memory repair logic is configured to operate in parallel with the test logic while the latter either supplies addressing information or attempts writing test data to the memory, to write data corresponding to the first address space into the content addressable memory (i.e., update the CAM.)

According to another feature of the invention, counting logic functions to count a number of the faulty memory cells in at least one column of the array of memory cells. Alternatively, the test logic may be configured to detect a number of the faulty memory cells in at least one column of the array of memory cells, the number satisfying a threshold criteria. According to another aspect of the invention, a semiconductor memory device comprises an array of memory cells including spare memory cells.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawing, in which.

DETAILED DESCRIPTION

Figure 1:
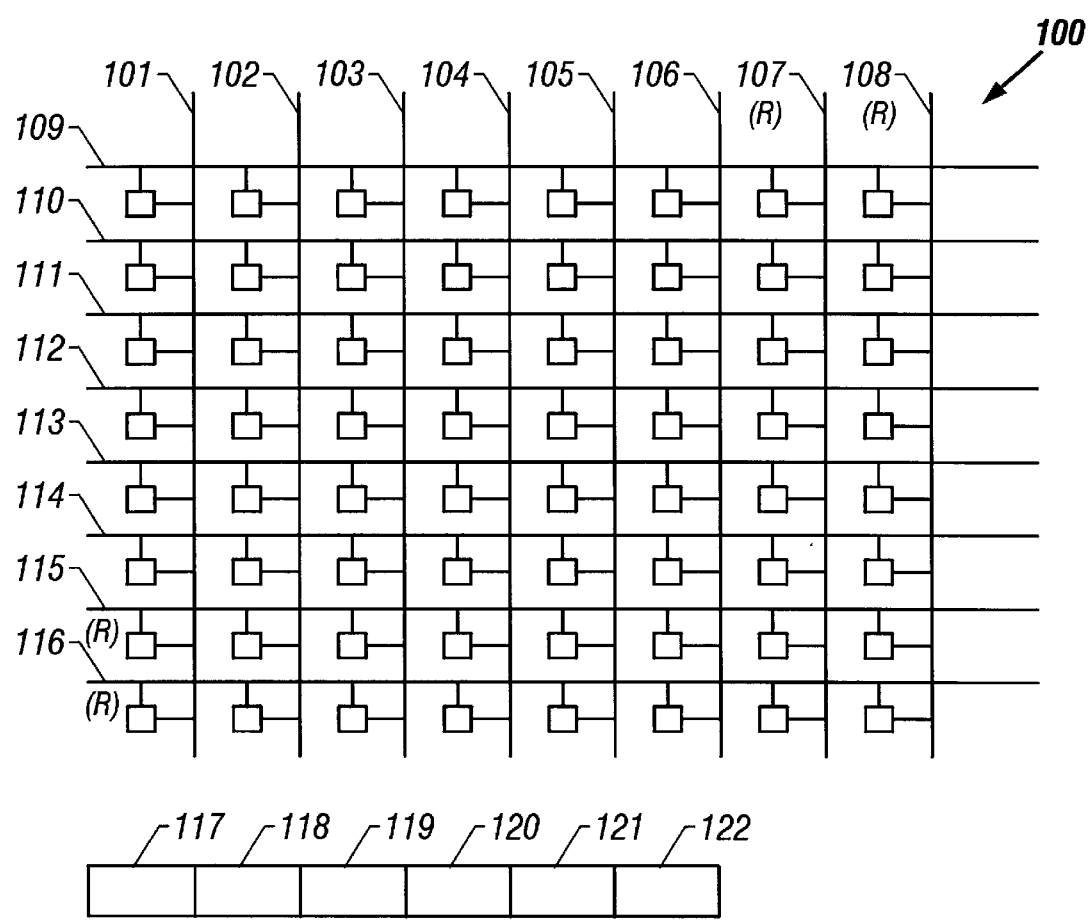
FIG. 1 is a diagram of an eight by eight memory cell array with an associated row of counters according to the invention.

FIG. 1 is a diagram of a memory array that contains eight columns, each column including a corresponding bit line 101–108, and eight rows, each having a common word line 109–116. (It is understood by those skilled in the art that the 64 bit memory is presented by way of example and for ease of illustration, semiconductor memories typically including much larger blocks of memory cells.) The eight columns include two redundant columns 107 and 108, and the eight rows include two redundant rows 115 and 116. Each of the six non-redundant bit lines 101–106 also has an associated counter register 117–122. For example, cell failures associated with bit line 101 are recorded in counter 117, failures on bit line 102 are recorded in counter 118, and so forth. At the completion of a BIST pass, the counters 117 through 122 contain a value which represents the number of memory errors which occurred during a march test of memory column 101 through 106, respectively. According to one embodiment, the count represents a total number of errors for all cells including multiple errors from a single cell (i.e., without regard to whether the errors represent multiple errors from a smaller number of cells or single errors from as many cells). Other implementations may distinguish between the number of failed cells by discounting multiple failures from a single cell, while other implementations may use a threshold counter to provide a single flag bit indicating a column pass/fail condition.

Figure 2:
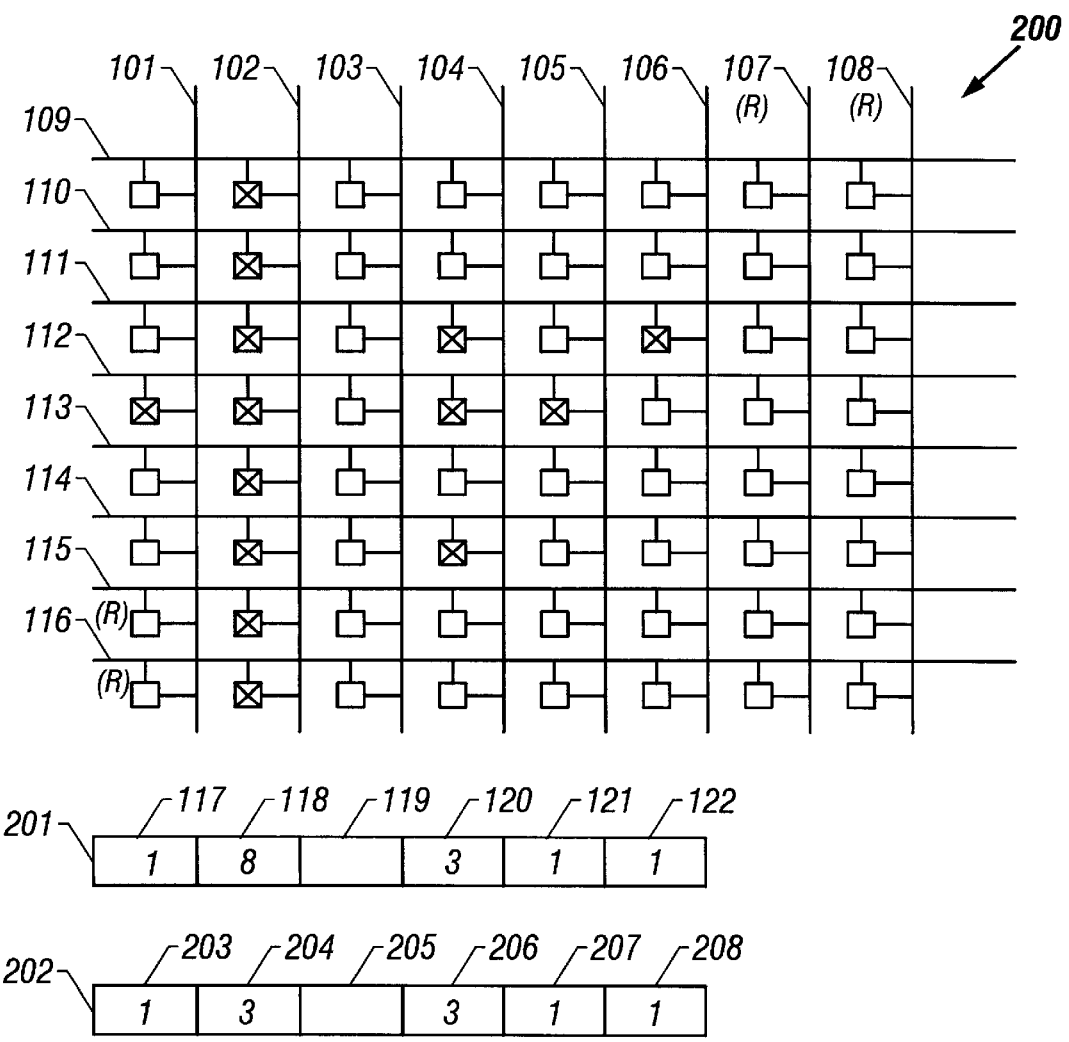
FIG. 2 is a diagram of an eight by eight memory cell array which contains a number of memory cell failures with associated rows of registers storing a total error and a saturated error count.

FIG. 2 is a diagram which shows a number of faults, indicated by the "x's", in an eight column, eight row memory array. The configuration depicted includes both normal counters and saturation counters, although it is expected that a commercial implementation would select just one type of counter and not include both. For example, a preferred embodiment of the invention includes saturation counters. At the completion of the first pass of BIST, each memory counter cell 117–122 of counter row 201 will contain the number of failed memory cells in a respective column of the eight by eight memory array. For instance, if testing of the memory cells in column 101 resulted in one error being detected then counter cell 117 would contain the value 1 as shown. Similarly, the memory cells in memory column 102 contains eight memory cell faults and therefore memory counter cell 118 contains the value 8. Alternatively, a semiconductor manufacturer may not be interested in the specific number of memory cell faults within a specific column and may instead decide to replace the memory column with a redundant column after a certain threshold value of memory cell faults occurs in that column, saturating the respective counter cell. Counter row 202 is an example of a counter row which saturates at a value of three, i.e., the memory counter cells are saturated after three memory cells have failed in that column; while subsequent memory cells may be tested and result in the detection of additional failures, the associated counter value no longer increases. Accordingly, for the eight by eight memory cell 200, counter cells 204 and 206 where each column contained three or more errors, now contain the number 3 in the saturated counter row. Thus, saturation counters may provide a simple go (e.g., less than three faults detected) or no-go (three or more faults) indicator as an output signal instead of, or in addition to, an actual count value.

Once the number of memory cell faults in each column has been tabulated, and the first step of BIST has been completed, the first pass of BISR can be performed by substituting a redundant column (or columns) for any column (and adjacent columns) which has failed the first pass of BIST. For the semiconductor manufacturer that has implemented counter row 201, a search must be made among the various counters to determine which counters are high enough to require the use of a redundant column. For the semiconductor manufacturer that implements the saturated counter 202, with a saturated value or 3, columns 102 and 104 which correspond to counter locations 204 and 206 respectively will be replaced with redundant columns. Whether saturated counters or maximum counter values are used, the selected threshold value determines the threshold between memory cells repaired by column replacement and row replacement. Once columns 102 and 104 have been replaced, the columns which contain the memory cells with faults is no longer included in the operational memory. The redundant columns are now included in the operational memory as replacement columns for the columns which contain memory cells with faults.

While the present embodiment describes replacing a single column with a redundant column, it would be apparent to one of ordinary skill in the art that multiple columns, or blocks of columns, may be replaced with multiple redundant, or redundant blocks of columns. Replacing columns in blocks rather than individually may be desirable because many faults may affect more than a single column. In this case, replacing groups of columns is more effective than replacing individual columns. A column group may include one or more columns.

Figure 3:
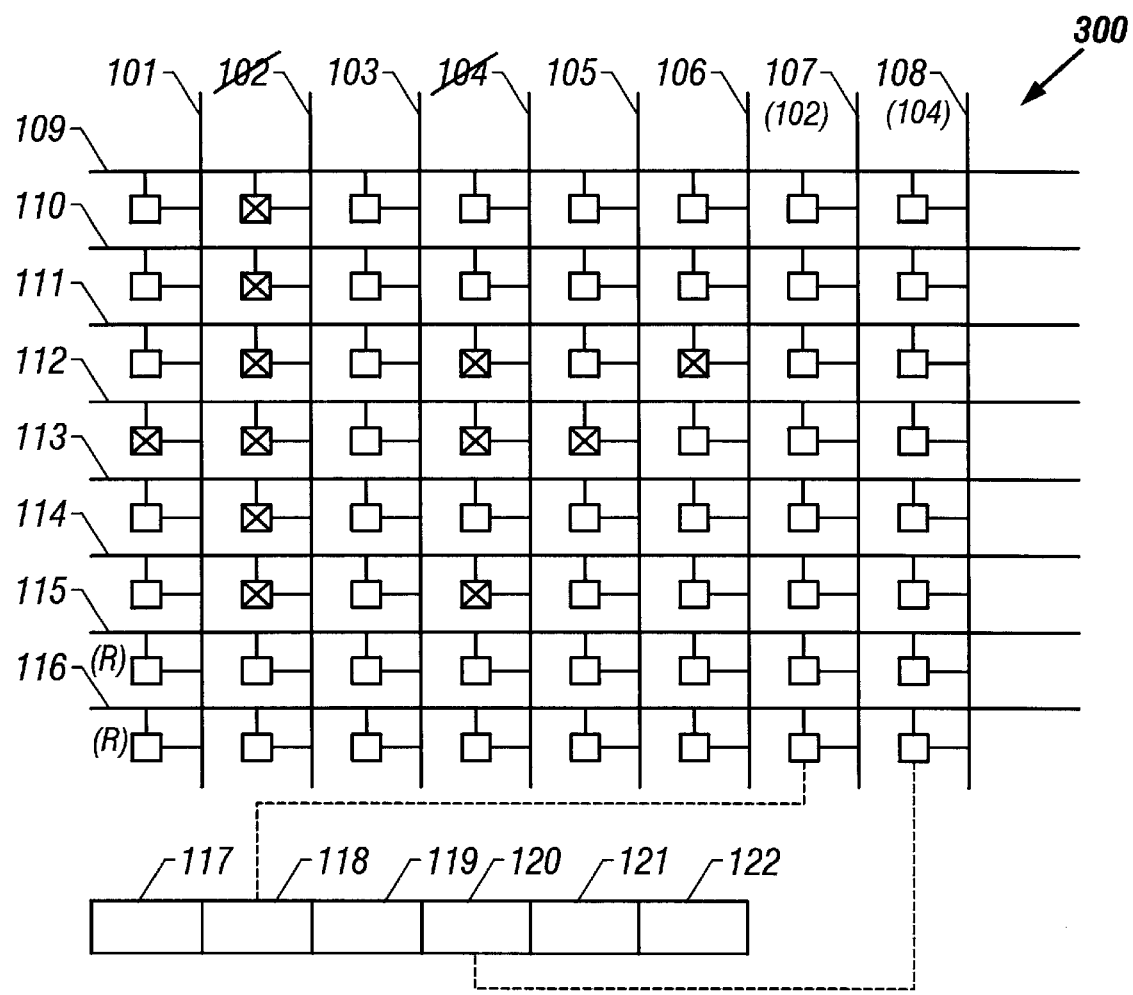
FIG. 3 is a diagram of an eight by eight memory cell array of FIG. 2 after redundant columns are configured to eliminate columns associated with saturated counter values.

FIG. 3 is a diagram of the memory array once columns 102 and 104 have been effectively replaced. As can be seen from FIG. 3, the error indicators associated with those replaced columns have been removed because the counter registers 118 and 120 have now been mapped to the redundant columns, as shown by the dotted lines. The second step in the BISR is an identification of the rows which contain errors and a replacement of those rows with redundant rows. As can be seen from FIG. 3, rows 111 and 112 contain memory cells with faults and, preferably, will be replaced with redundant rows.

Figure 4:
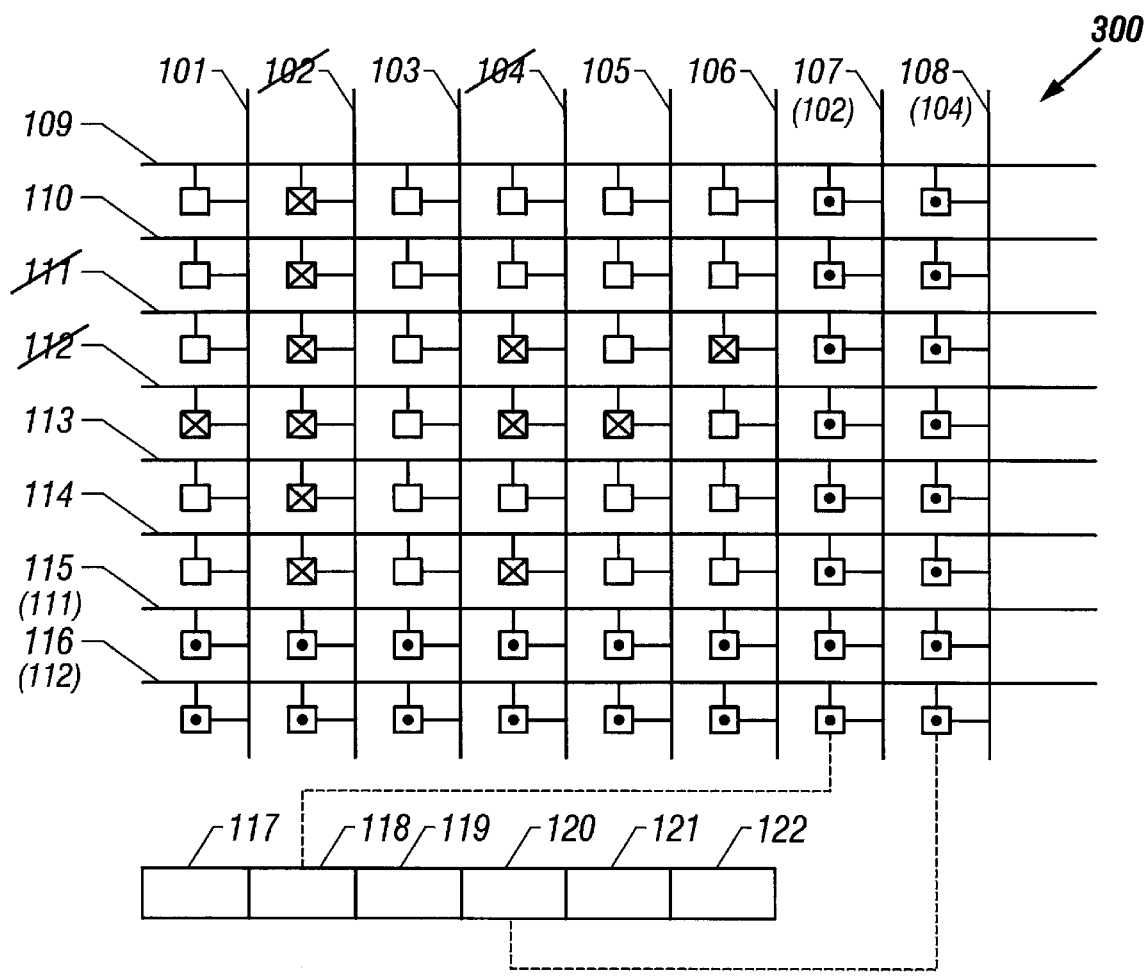
FIG. 4 is a diagram of an eight by eight memory cell array of FIG. 3 after redundant rows are configured to eliminate all remaining rows which contain faulty memory cells highlighting untested cells.

FIG. 4 is a memory array diagram which shows the absence of remaining faults (shown by the absence of x's in the memory cells contained in the operational or active memory array) after rows 111 and 112 have been replaced. As can be seen from FIG. 4, the use of two redundant columns and two redundant rows eliminate all of the memory cells which contained faults from the active or operational memory array. The operational memory now contains columns 101, 103, 105, 106, 107 and 108 where 107 has replaced 102 and 108 has replaced 104. The operational memory now contains rows 109, 110, 113, 114, 115 and 116 where row 115 replaced row 111 and 116 has replaced row 112.

FIG. 4 also contains cells which are contained within operational or active memory which have not undergone BIST. These untested cells are identified in FIG. 4 by dots. As can be seen by this limited example a large number of memory cells currently contained in the memory array have not been through BIST. Typically, with normal size memory arrays, only a small number of columns and/or rows are effectively replaced. Since an array in which replacement columns or rows have been used contains untested cells, a second pass of BIST must be run to ensure that each of the replacement memory cells contained within the memory array performs satisfactorily. BIST is again performed to identify the memory cells which contain faults, and the number of memory cell faults contained within each of the columns. As with the first BIST pass, columns containing memory faults which saturate the counter bit, or contain errors in excess of a predetermined number, are replaced with redundant columns. Once those redundant columns have electrically or logically replaced columns which saturate or exceeded the number of faults allowed, the redundant rows are used to replace faulty memory cells until all memory cell faults are eliminated. Alternating between BIST and BISR is continued until BIST is run without any memory cell failures or until the redundant columns and rows are exhausted and the memory array is unuseable.

Figure 5:
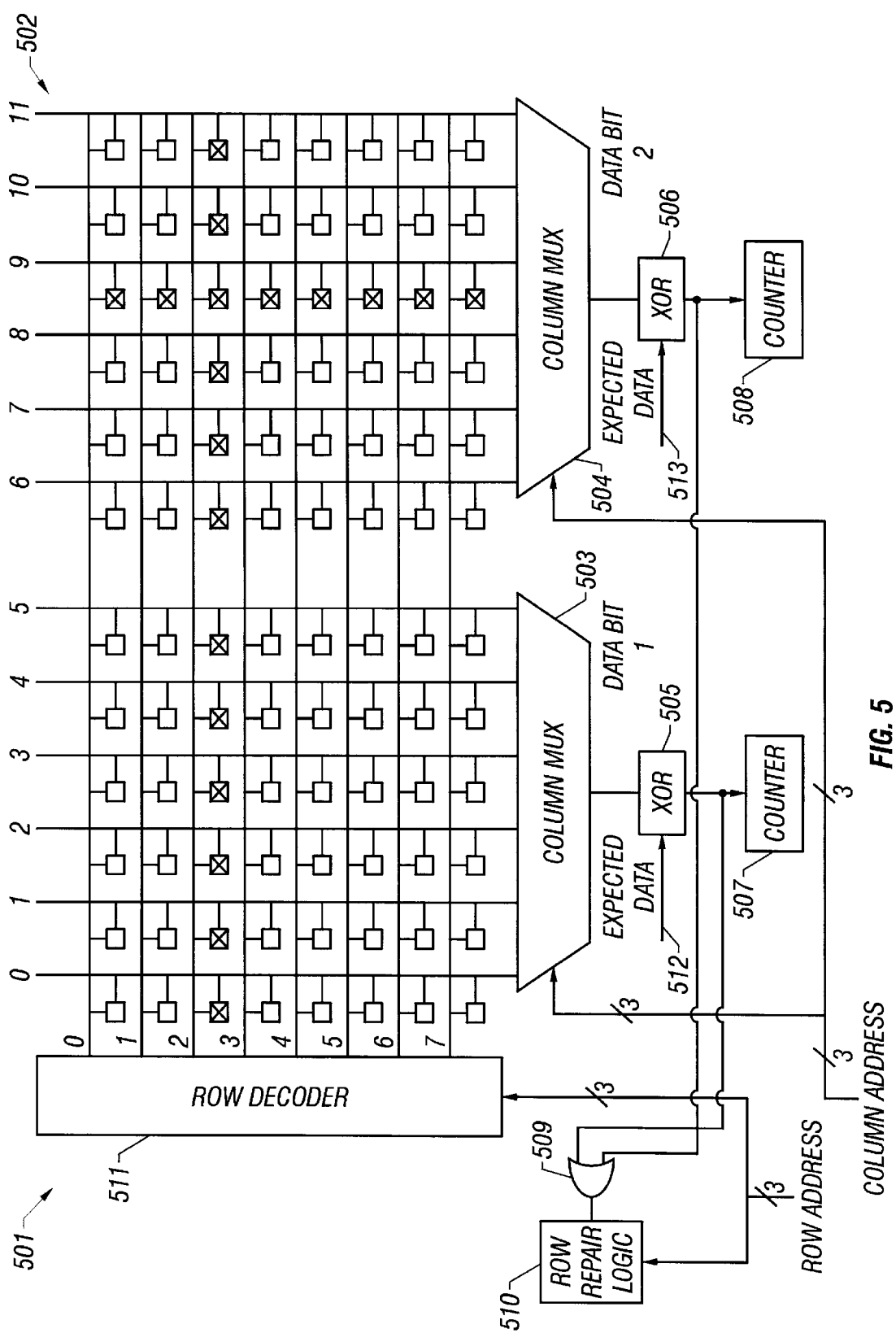
FIG. 5 is a diagram which shows a hardware implementation of an embodiment of the present invention.

FIG. 5 is a diagram which shows two memory arrays of six columns each (0–5 and 6–11) where each array has 8 rows (0–7). FIG. 5 includes memory array 501 and 502, two column multiplexers 503 and 504, exclusive "OR" (XOR) gates 505, 506, two counters 507 and 508, an OR gate 509, a row repair logic block 510 and a row decoder 511. To reduce the time required for testing, the memory contained in a device can be divided into separate memory arrays and all arrays tested simultaneously. BIST can be configured to simultaneously test column 0 of memory array 501 and column 6 of memory array 502 with the resulting test information applied to column multiplexers 503 and 504, respectively. (One of ordinary skill in the art would understand that this capability is not limited to testing two memory blocks simultaneous and can be expanded to simultaneously test several blocks as desired.) For instance, after a write "1" is applied to each memory cell in memory arrays 501 and 502, each memory cell is expected to contain the value one. Each cell's stored value is applied to the column multiplexers and the value stored in and read from the cell is compared in XOR gates 505 and 506 with the expected data 512 and 513. If the cell's stored value matches the expected value, the integer value stored in the counter 507 and 508 is not incremented. If, however, the values do not match, the corresponding counter 507 or 508 is incremented. As previously detailed, prior art correction techniques are fully described in U.S. Pat. Nos. 5,255,227, 5,848,077 and 6,000,047 which are hereby incorporated herein by reference.

Testing is continued in this manner until BIST is completed for each cell in each column and the values representing total failures or saturation values are associated with each column of each memory array. Once columns are identified which have failed BIST by having at least a predetermined number of failed cells, redundant columns are used to replace those columns. Row replacement with redundant rows is then used to replace rows which continue to contain a cell failure until all cell failures are eliminated from the memory array. Replacement of columns and rows is dependent on the availability of redundant columns and rows respectively. If an insufficient number of replacement rows are available to fully replace all rows having defective cells, any remaining spare columns may be used prior to deciding that the array cannot be fixed.

Typically, a spare row of memory cells is made to substitute for a defective row by transforming a row address signal to select the spare row instead of the defective row. Column substitutions are performed using multiplexers on the bit lines to switch between adjacent lines (or groups of adjacent lines), effectively shifting the defective column out, while providing access to a spare column (or columns) physically located at the end of the array. This technique is filly described in commonly assigned and co-pending U.S. patent application Ser. No. 09/506,620, entitled "Redundancy Programming Using Addressable Scan Paths to Reduce the Number of Required Fuses," filed Feb. 18, 2000, which is hereby incorporated herein by reference.

Figure 6:
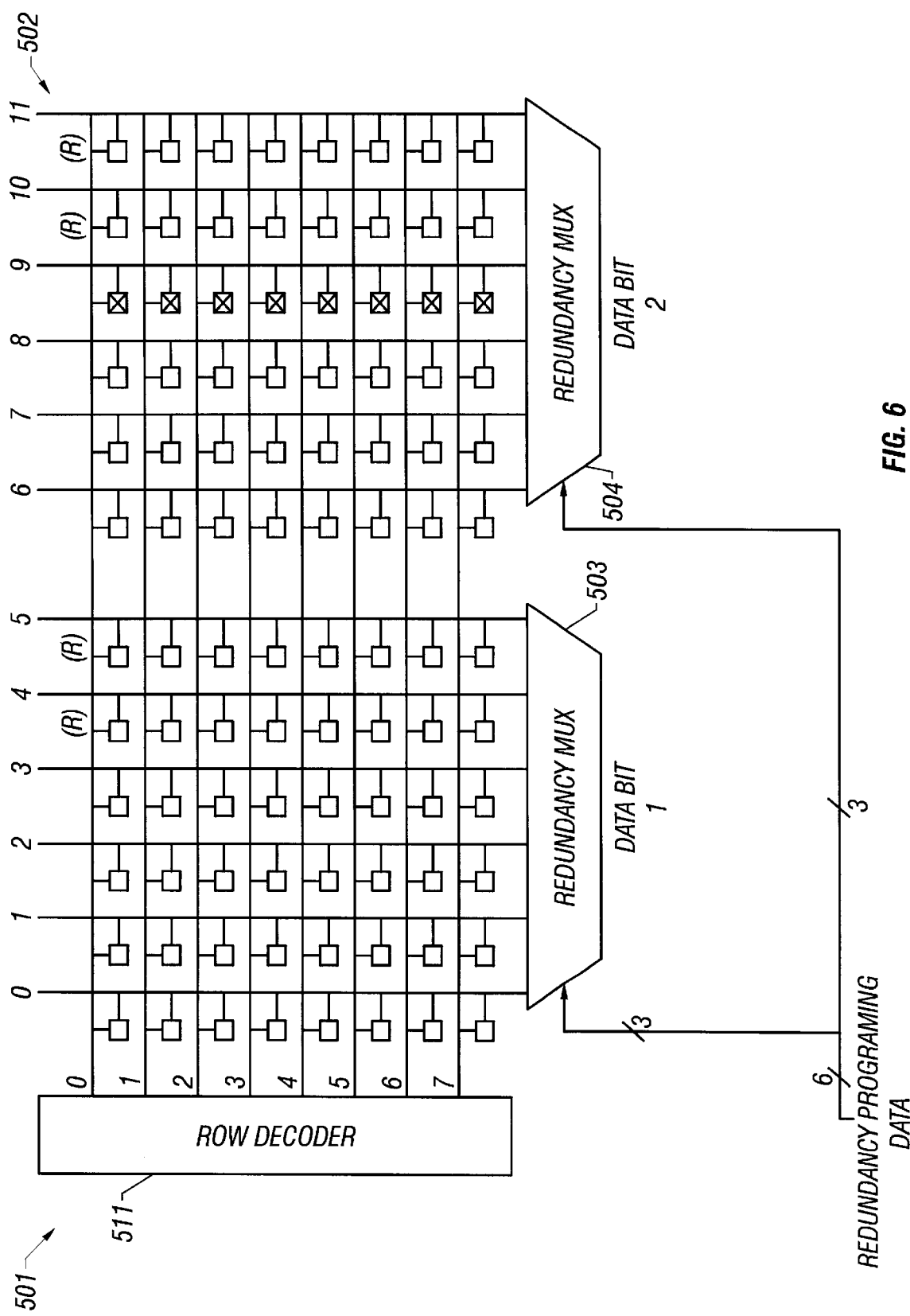
FIG. 6 is a diagram of the RAM array with redundancy multiplexers used to perform column replacement.

FIG. 6 is a diagram of the RAM array with redundancy multiplexers used for column replacements. In this embodiment, multiple columns can be replaced at a time. FIG. 6 contains two memory groups, 501 and 502 which contain four operational columns, columns 0 through 3 in memory group 501, and columns 6 through 9 in memory group 502 and two redundant columns in each memory group, columns 4 and 5 in memory group 501 and columns 10 & 11 in memory group 502. Redundancy multipliers 503 and 504 are programmed with redundancy programming data and are used to shift data around columns containing cells with faults. In the figure each column included in the diagram can correspond to one or more adjacent columns of cells. For example, in the event that cells included in column 9 contained faults, as shown, column 10, a redundant column could be used instead of column 9. Column 11 remains as a redundant column for future use.

As previously described, addresses of rows which contain non-operational cells are typically stored and mapped to a redundant row. These row addresses may be stored in a content addressable memory (CAM). In a preferred embodiment, both cell testing and replacement of rows containing non-operational cells with redundant rows occur simultaneously, i.e., identification of faulty row address information is stored into the CAM immediately following cell testing and while subsequent rows are undergoing test. This simultaneous operation is used to minimize the amount of scratch memory needed to store row fault addresses and minimize time spent on testing and correcting the memory arrays.

Figure 7:
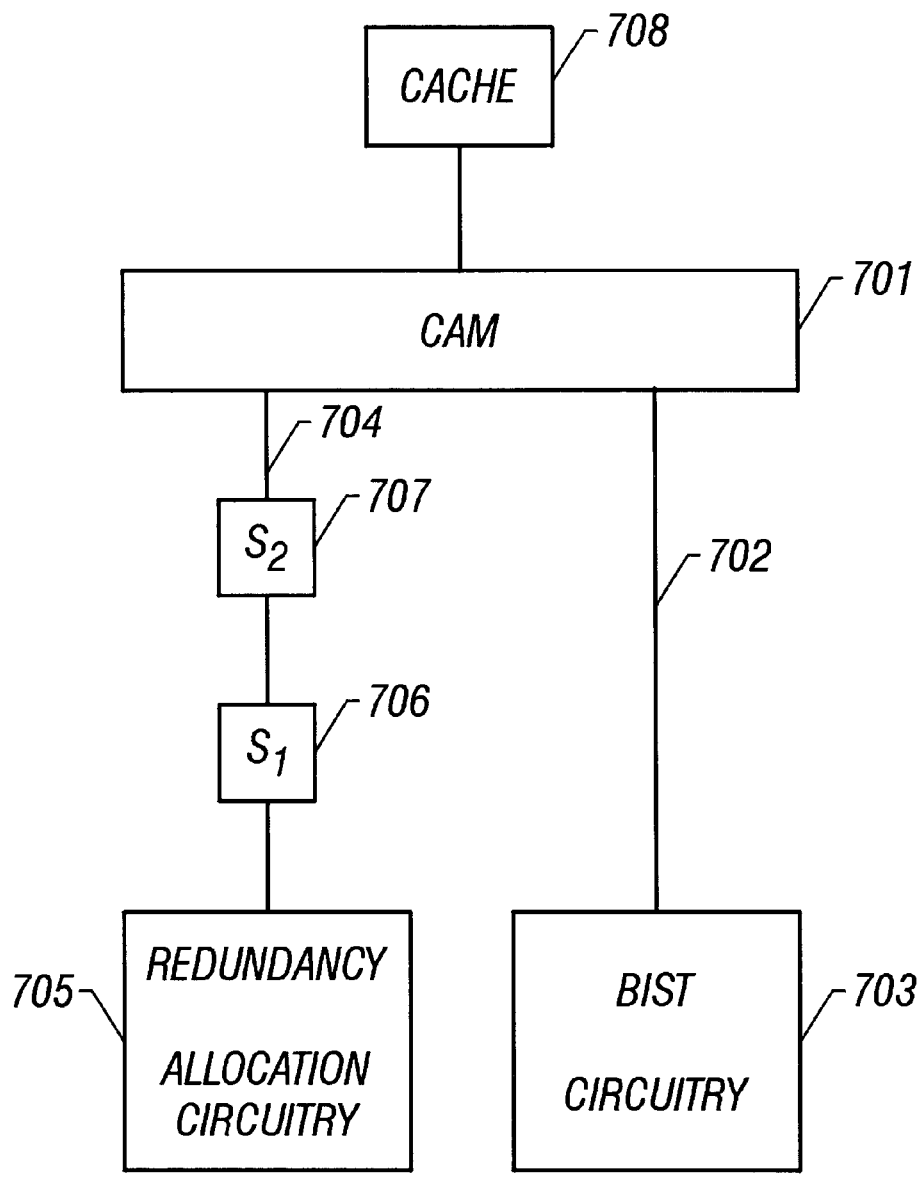
FIG. 7 is a block diagram of access to the content addressable memory by the redundancy allocation and BIST circuitry.

FIG. 7 is a block diagram of a content addressable memory (CAM) which stores row addresses of defective rows or groups of rows. CAM 701 is used to access rows which are currently being tested as well as to store the addresses of rows which need to be replaced. That is, CAM 701 provides any required address translation for defective row address space to substitute an appropriate address space in redundant memory, including address translation for testing.

CAM 701, appears externally to include two address input ports, or "ways" in which CAM 701 may be accessed. One of these ports 702 is used by BIST circuitry 703 to access specific rows of memory for testing the individual memory cells contained within it. Second port 704 is used by redundancy allocation circuitry 705 to store row addresses which contain non-operational cells. The row addresses typically are not stored nor are they accessed in a single clock cycle and a pipeline is typically included in port 704. In FIG. 7 a two stage pipeline consisting of a first stage 706 and a second stage 707 is shown.

Internally, CAM 701 is single ported in that it performs one access operation at a time. When CAM 701 receives a write or read request of a specific memory address (note that, as far as CAM 701 is concerned, the referenced memory address is handled as data) from BIST circuitry 703, this request is passed through CAM 701 to memory cache 708. If the memory address matches a previously stored memory address space indicating a faulty section of memory, CAM 701 provides a match signal to effectuate a substitution of redundant memory for the faulty section of memory. Alternatively, when CAM 701 receives a row address from redundancy allocation circuitry 705, the row address passes through pipeline stages 706 and 707 to port 704 and is stored by the CAM and a replacement row is mapped. In a preferred embodiment, multiple rows may be grouped together and tested, and if necessary, replaced together. If, for instance, four rows of memory are grouped together, the least significant two bits may be ignored and the four rows of memory will be treated as a single entity.

Since two operations may be initiated at the same time, i.e., access from BIST circuitry on port 702 and storage of a row address corresponding to non-operational cells, while CAM 701 can only address one access operation at a time, a scheme must be developed to handle both incoming requests. The invention solves this conflict by assigning priority to the writing of the row address which contains the non-operational cell.

There is a fixed time delay between a row failure being detected and when the address of the row containing the non-operational cell reaches CAM 701. Priority can be given to the storing of the row address data into CAM 701 by extending those fixed time delays to eliminate conflicts. Correct operation of both the storage of the row address and BIST circuitry testing is assured by scheduling a BIST circuitry write or other access attempt to occur simultaneously with the CAM memory write. BIST circuitry accesses access (read or writes) scheduled to occur sequentially, to eliminate conflicts between a CAM write and a BIST circuitry read.

One of ordinary skill in the art would understand that the memory cell array, the supporting structure (including the address decoders, sense amplifiers, clocks, etc.) other structure (e.g., processor/controller, central processing unit, input/output devices, etc.) and built-in self test and built-in self repair are all formed as one integral chip or a semiconductor chip or die including a semiconductor substrate.

Figure 8:
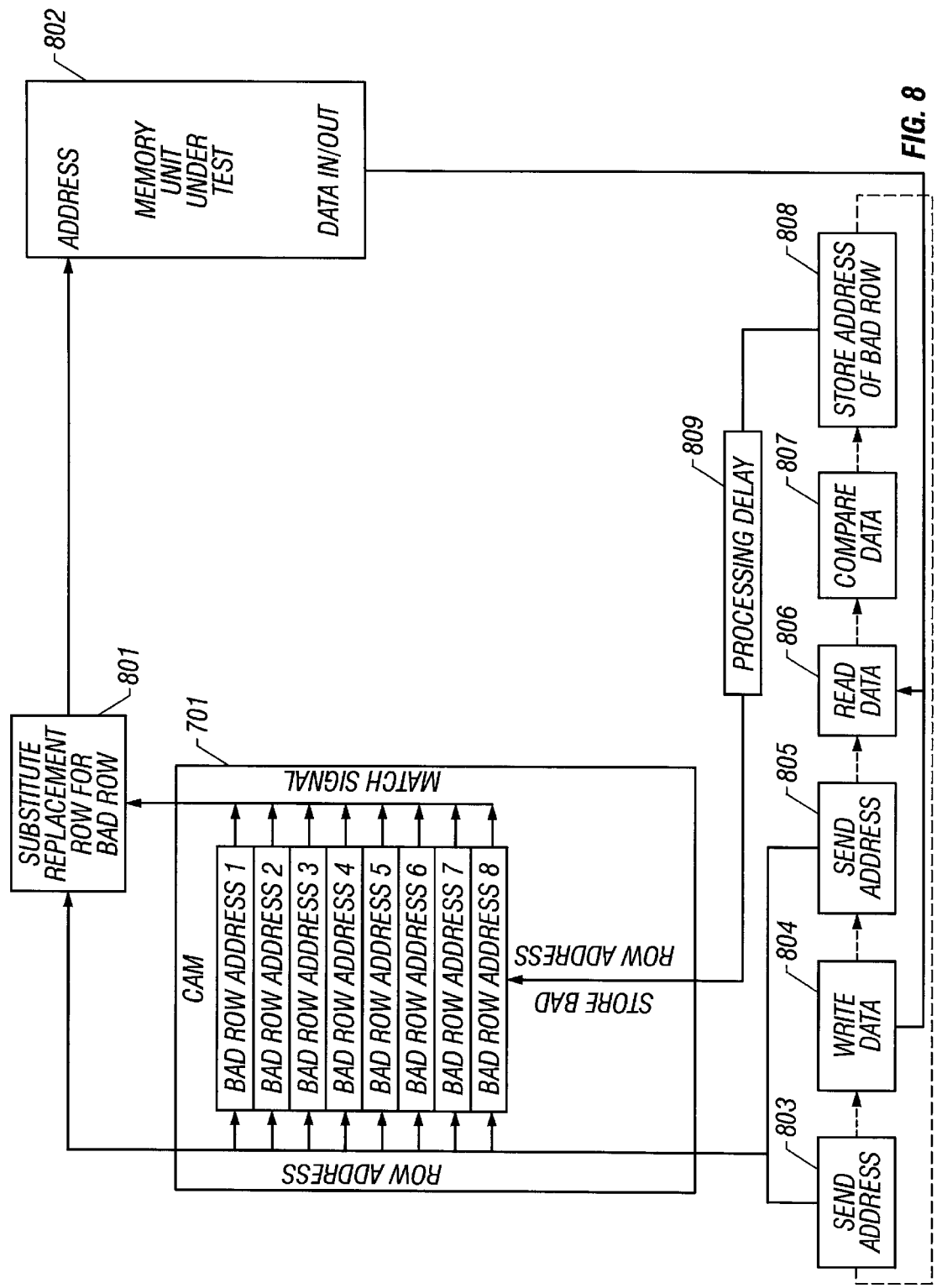
FIG. 8 is a diagram of BIST and BISR according to one embodiment of the invention.

FIG. 8 is a diagram showing the relative sequence of BIST followed by BISR, if required to reroute memory address requests to a redundant portion of memory. As depicted, CAM 701 includes eight content addressable memory locations, each storing, for example, the eleven high order bits of a memory address. If a cell address matches address space data stored in CAM 701, then an appropriate match signal is supplied to Row Address Substitution circuit 801. This may cause an address corresponding to an appropriate group of redundant rows to be substituted for the portion of the address designating a defective group of rows. The resultant address signal is then applied to memory 802, accessing a specified memory cell, so that data can be written into or read from the cell.

In this example, we assume that a certain number of the low order address bits are used to distinguish between minimum addressable units (for this example and purposes of illustration, bits) within a row and a particular row within a predefined minimum replaceable group size of rows, e.g., four rows. For example, a twenty bit address space may have the 7 least significant bits designating (i.e., addressing) one of 128 bits constituting a row, the next two most significant bits designating one of four rows within each four-row group, and the most significant eleven bits designating one of 2048 four-row groupings. Since rows are substituted in groups, the CAM need only store the eleven most significant bits of an address to determine if the address to be accessed is part of a four-row group address space previously determined to include a defective cell.

The BIST portion nominally includes five steps. Initially, an address of a cell to be tested in Memory 802 is generated at step 803, the address being supplied to CAM 701 for possible translation, i.e., remapping into redundant memory if the address supplied is part of a defective address space including a defective row of memory cells. If the address of the cell being tested has not previously been determined to fall withing the address space of a defective row group, then the address from step 803 is passed unchanged to the memory under test 802. Alternatively, if the high order bits of the address match an entry in CAM 701, then a match signal is produced initiating an access of corresponding redundant group of four rows, the least significant bits of the address are used to designate one of the four rows and a byte within that row as in the uncorrected case.

Once the appropriate address signal is supplied to memory unit under test 802, test data is written into the designated cell or cells at step 804. Reading from the cell or cells requires retransmitting the address of the cell under test at step 805 as previously described in connection with step 803. Now, however, data is read from the cell or cells at step 806 and, at step 807, this data is compared to the data as stored. A match indicates that the cell appears to be operational (subject to further testing), while a mismatch indicates a defect or fault. If a defect is identified, then the address of the corresponding row group is stored into CAM 701 at step 808. However, storage of the "bad" address group is subject to processing delay 809. Unfortunately, the delay causes a conflict between address data being written into CAM 701 and the next memory access starting at step 803. Thus, writing to CAM 701 may result in a change of address translation occurring between steps 803 and 806 so that test data may be stored into one cell location but read from a different location.

Figure 9:
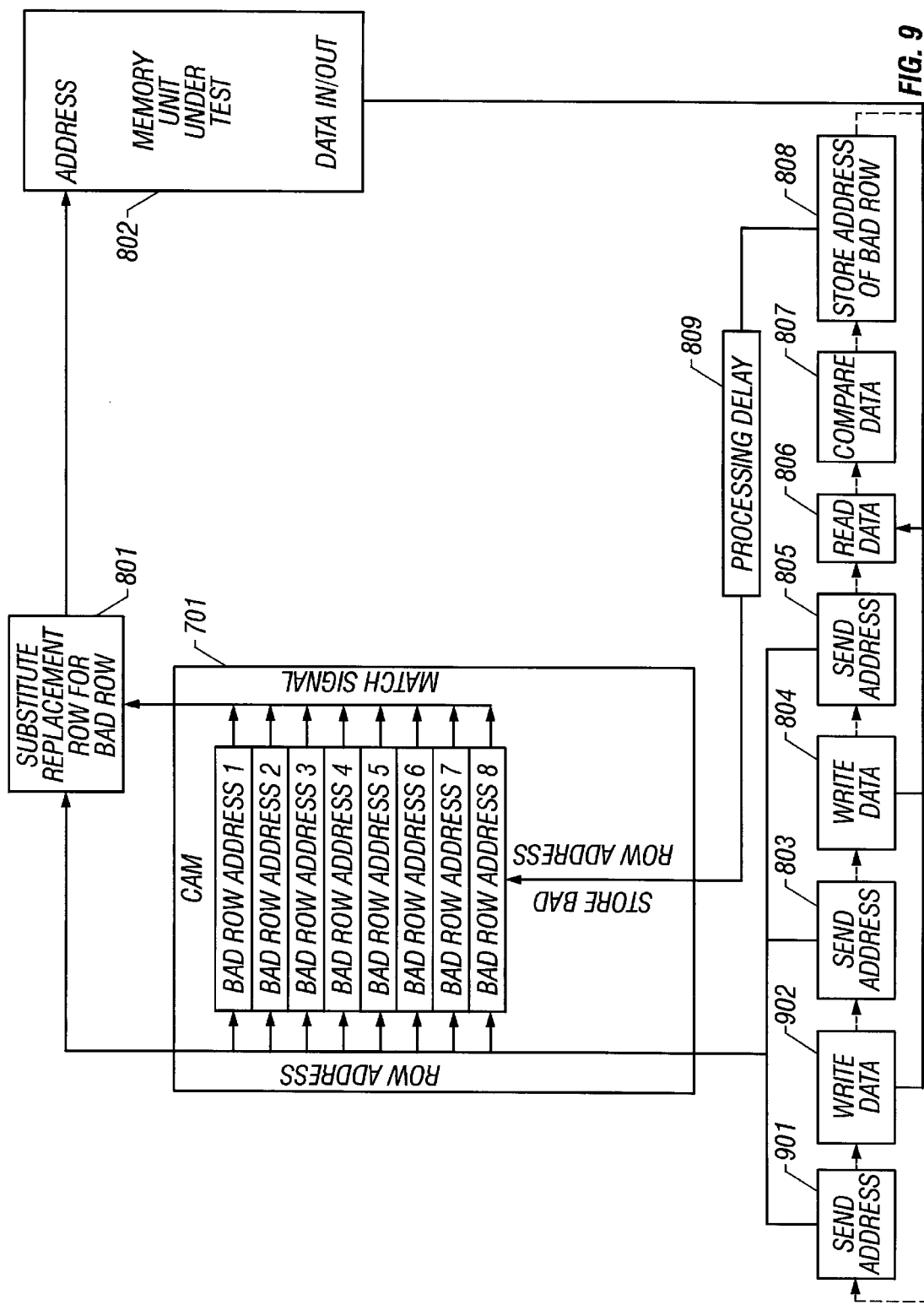
FIG. 9 is a design if BIST and BISR according to an alternate embodiment of the invention.

Referring to FIG. 9, a delay is introduced in the form of steps 901 and 902 so that updating of CAM 701 according to step 808 and subject to delay 809 is completed prior to storage of test data. In particular, steps 901 and 902 duplicate the actions of steps 801 and 802, respectively. Thus, the address of a cell under test is supplied to CAM 701 at step

901. In the case where step 808 is simultaneously implemented to provide updated address data to CAM 701, a conflict will result so that an erroneous address or no address may be supplied to memory 802 by step 901. This possibility results in data to be written into memory 802 not being properly stored in response to step 902. To accommodate failures to properly store test data into memory 802 caused by such conflicts, steps 803 and 804 repeat the process of supplying the address of the cell under test and data to be stored into the cell to assure the test data storage into the desired cell is properly accomplished. Repeated access to memory will also introduce the desired delay. Processing then continues as detailed in connection with FIG. 8 to read the test data back out from the cell under test, compare the data as read to the data as written, and implement any required updates to CAM 701 to account for any defective memory cell identified by the test.

While the example of FIG. 9 illustrates introduction of a first pair of memory access operations in the form of steps 901 and 902 followed by an immediate repetition of those same steps by steps 803 and 803 other steps may be substituted for 901 and 902 so that steps 803 and 804 do not conflict with steps 808 and 809 of a previous iteration or cycle. For example, step 902 may read data rather than write data, so long as the outcome of the read operation is not relied upon. It is further understood that, while the desired memory access is illustrated in the form of Write Data step 804, other memory access operations may benefit from the inclusion of steps 901 and 902 including a Read Data step. Of course, in the case of the latter, it is recognized by one skilled in the art that step 902 should not be a Write Data operation which might disturb the contents of the memory if the operation were successful; Instead, a user might substitute a Read Data operation at step 902.

As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. While the current invention has been described using memory cell arrays, one of ordinary skill in the art would understand that the invention can be applied to any multicelled device in which retention of physical position is not important and redundant columns or rows of devices can be substituted for failed devices. For example, the invention is equally applicable to arrays of multipliers and adders.

What is claimed is:

1. A method of configuring a memory array to replace faulty memory cells with spare memory cells, comprising the steps of:
   (i) identifying a first address space including a faulty memory cell;
   (ii) attempting to supply data corresponding to a second address space to a content addressable memory;
   (iii) attempting to access at least one memory cell addressed in response to step (ii);
   (iv) writing, during at least some portion of a period including the performance of at least one of steps (ii) and (iii), data into said content addressable memory corresponding to said first address space;
   (v) reattempting to supply said data corresponding to said second address space to said content addressable memory;
   (vi) reattempting to access said at least one memory cell addressed in response to step (iv); and
   (vii) processing data from said at least one memory cell.

2. The method of claim 1 wherein steps (i) through (vii) are repeated and step (v) is performed immediately after completion of step (iii).

3. The method of claim 1 further including a step (viii) of introducing a processing delay between a performance of step (i) and step (v).

4. The method of claim 1 wherein said first address space specifies a row of the array.

5. The method of claim 1 further comprising a step of mapping said first address space into an address space of a spare row of memory cells.

6. The method of claim 5 further comprising the steps of:
   configuring columns of said memory array to replace one of said columns including said remaining faulty memory cell with a spare one of said columns; and
   identifying at least a remaining one of said faulty memory cells after said configuring step.

7. The method of claim 5 further comprising a step of counting a number of said faulty memory cells in at least one column of said memory array.

8. The method of claim 5 further comprising a step of detecting a number of said faulty memory cells in at least one column of said memory array satisfying a threshold criteria.

9. A memory comprising:
   an array of memory cells including spare memory cells;
   memory cell address logic including:
      (i) a content addressable memory storing data representing address spaces corresponding to faulty ones of said memory cells, and
      (ii) memory cell configuration logic responsive to an output of said content addressable memory for mapping said address spaces corresponding to said faulty memory cells address spaces to respective address spaces of ones of said spare memory cells;
   test logic configured to perform testing operations to:
      (i) identify a first address space including a faulty memory cell,
      (ii) attempting to supply data corresponding to a second address space to said content addressable memory,
      (iii) attempt to access at least one memory cell in said second address space,
      (iv) reattempting to supply said data corresponding to said second address space to said content addressable memory,
      (v) reattempt to access at least one memory cell addressed, and
      (vi) processing data from said at least one memory cell;
   memory repair logic configured to, during at least some period overlapping execution of one of said attempting to supply data and attempt to access testing operations by said test logic, write data corresponding to said first address space into said content addressable memory.

10. The memory according to claim 9 wherein said test logic repeatedly executes said testing operations (i) through (vi) are repeated in the enumerated order and memory repair logic is responsive to an outcome of said compare test operation to write said data corresponding to said first address space into said content addressable memory.

11. The memory according to claim 9 wherein said first address space specifies a row of the array.

12. The memory according to claim 9 wherein said content addressable memory includes a plurality of memory locations for storing a corresponding plurality of datum corresponding to address spaces of rows of said array of memory cells including faulty ones of said memory cells.

13. The memory according to claim 12 wherein each of said address spaces defines a plurality of rows of said array of memory cells.

14. The memory according to claim 9 wherein said memory cell address logic is operative to map said first address space into an address space of a spare row of said spare memory cells.

15. The memory according to claim 14 wherein said memory cell address logic is operative to configure columns of said array of memory cells to replace one of said columns including faulty memory cell with a spare one of said columns; and said test logic is further configured to identify at least one faulty memory cell remaining after said memory cell address logic reconfigures said columns of said array.

16. The memory according to claim 14 further comprising counting logic configured to count a number of said faulty memory cells in at least one column of said array of memory cells.

17. The memory according to claim 14 wherein said test logic is further configured to detect a number of said faulty memory cells in at least one column of said array of memory cells, said number satisfying a threshold criteria.

18. A semiconductor memory device comprising:

an array of memory cells including spare memory cells;

first means for identifying a first address space including a faulty memory cell;

second means for attempting to supply, to a content addressable memory, data corresponding to a second address space;

third means for attempting to access at least one memory cell within said second address space;

fourth means operable during an operation of one of said second and third means for addressing data into said content addressable memory corresponding to said first address space;

fifth means for attempting to resupplying to said content addressable memory said data corresponding said second address space;

sixth means for reattempting to access said test data into said at least one memory cell; and seventh means for processing data from said at least one memory cell.

19. The semiconductor memory device according to claim 18 wherein said first address space specifies a row of the array.

20. The semiconductor memory device according to claim 18 further comprising:

eighth means for identifying at least a first one of said faulty memory cells; and ninth means for configuring columns of said memory array to replace one of said columns including said remaining first faulty memory cell with a spare one of said columns.

* * * * *